United States Patent [19]

Shimada et al.

[11] Patent Number: 5,362,513
[45] Date of Patent: Nov. 8, 1994

[54] METHOD OF MANUFACTURING A PATTERN OF CONDUCTIVE FINE-LINE FILMS AND SETTING INK USED FOR THE SAME

[75] Inventors: Mikinari Shimada, Yawata; Hirotoshi Watanabe, Osaka; Satoru Fujii, Takatsuki; Masato Hagino, Osaka; Masahide Tsukamoto, Nara, all of Japan

[73] Assignee: Matsushita Electric Industrial Co., Ltd., Osaka, Japan

[21] Appl. No.: 698,563

[22] Filed: May 10, 1991

[30] Foreign Application Priority Data

May 10, 1990 [JP] Japan ................................. 2-120247
May 10, 1990 [JP] Japan ................................. 2-120248

[51] Int. Cl.$^5$ ............................................. B05D 1/00
[52] U.S. Cl. ....................................... 427/58; 427/96; 427/259; 427/264; 101/170
[58] Field of Search ................... 427/259, 96, 264, 58; 101/170

[56] References Cited

U.S. PATENT DOCUMENTS 4,479,432 10/1984 Masaki et al. ..................... 101/170

FOREIGN PATENT DOCUMENTS 55-36512 9/1980 Japan .
2-244795 9/1990 Japan .

OTHER PUBLICATIONS

A publication in the "Advanced Hybrid Technology" report.
WPI Acc. No. 90-126293/17, abstract of European Patent EP 365169 to Enomoto et al., Apr. 1990.
WPI Acc. No. 90-038094/06, abstract of West German Patent No. 3924716 to Pinkasov, Feb. 1990.
A computer printout of "WPI Acc No: 90-038094/06".
Shimada et al., "Manufacturing of Fine-Line Films by Printing Technique", IMC 1990 Proceedings, Tokyo, May 30-Jun. 1, 1990, pp. 581-586.
A computer printout of "WPI Acc No: 90-126293/17".
"Printing Irregular Surfaces", European Plastics News, Oct. 1977, pp. 13-14.

*Primary Examiner*—Shrive Beck
*Assistant Examiner*—Vi Duong Dang
*Attorney, Agent, or Firm*—Wenderoth, Lind & Ponack

[57] ABSTRACT

A pattern forming method comprises at least a lower pattern forming step for printing a setting ink on a substrate, a setting step for setting the setting ink, an upper layer pattern forming step for forming a metalo-organic compound paste layer on the lower layer pattern by a printing method, and a firing step for firing at high temperature to remove the lower layer pattern. In the upper layer pattern forming step, the metalo-organic compound paste is printed so that the metalo-organic compound paste may be divided on the hardened setting ink so as to fill up gaps of the lower layer pattern. Otherwise the metalo-organic compound paste is printed on the hardened setting ink, and the metalo-organic compound paste is mechanically cut off, before the metalo-organic compound paste is dried, on the hardened setting ink, thereby forming an upper layer pattern. The setting ink comprises a thermo-setting resin, a setting agent, and an organic solvent, with an amount of nonvolatile materials of 50 to 70 wt. %, or comprises a carbon powder, a thermo-setting resin, a setting agent and an organic solvent, with an amount of nonvolatile materials of 60 to 80 wt. %.

15 Claims, 3 Drawing Sheets

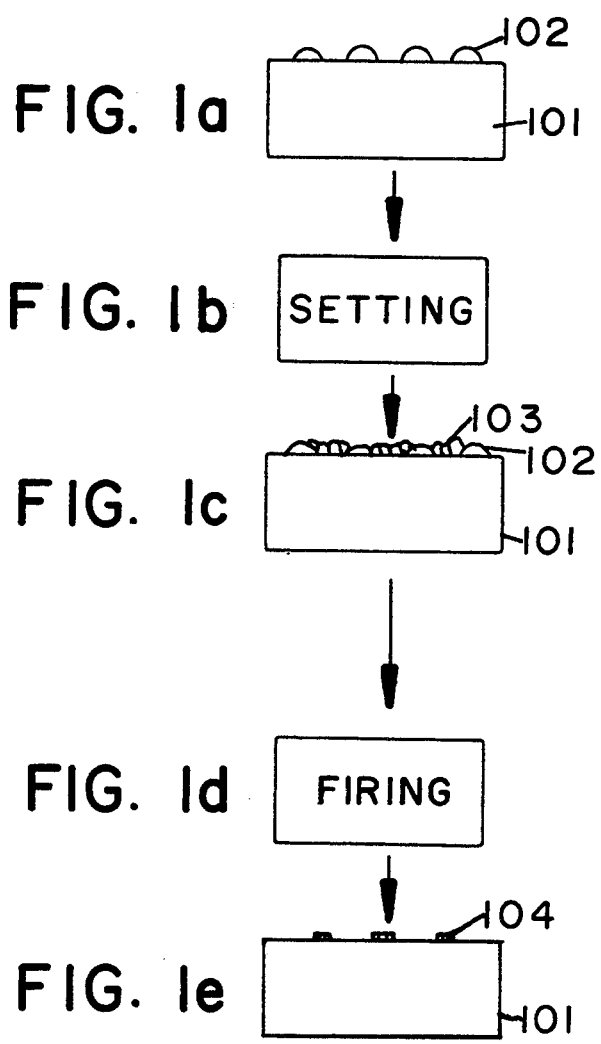

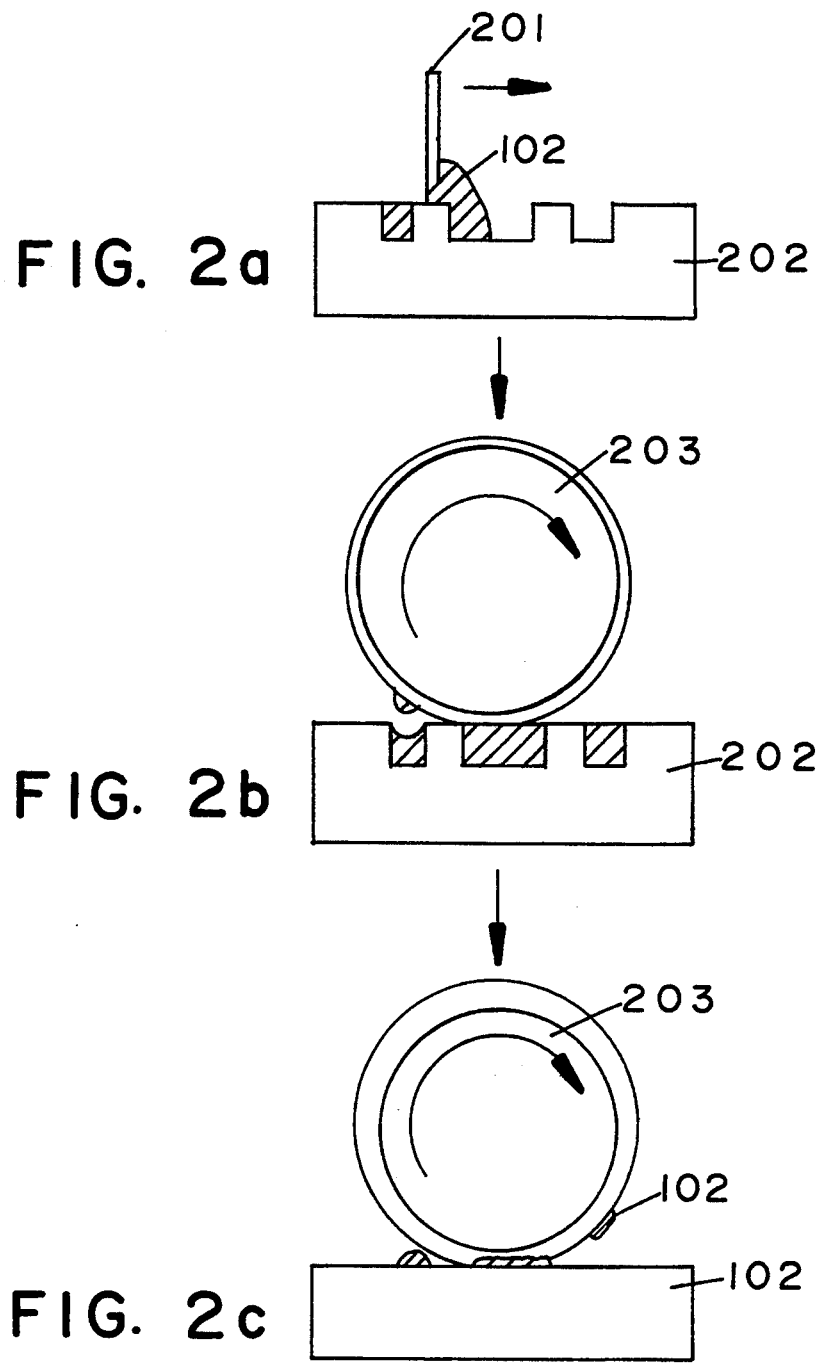

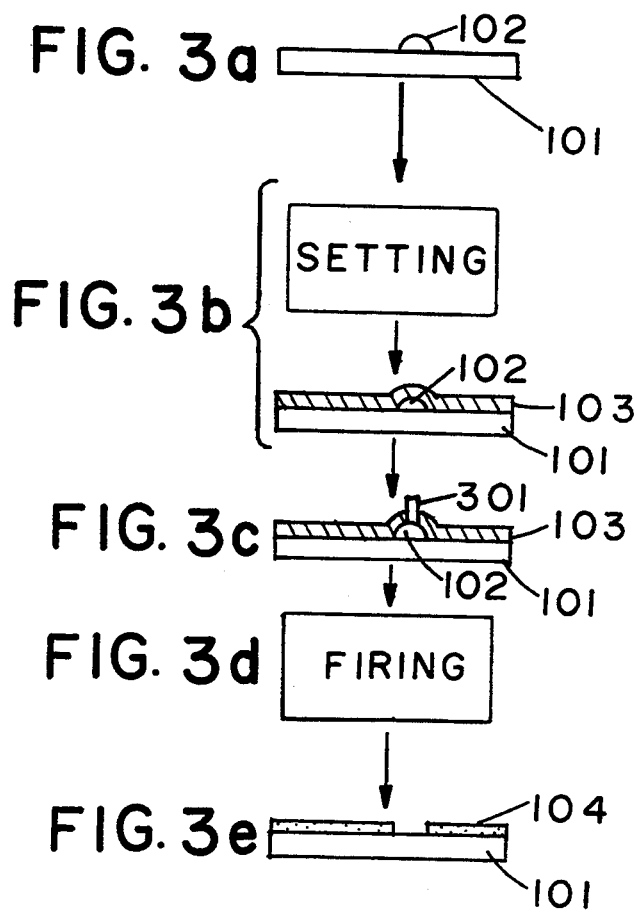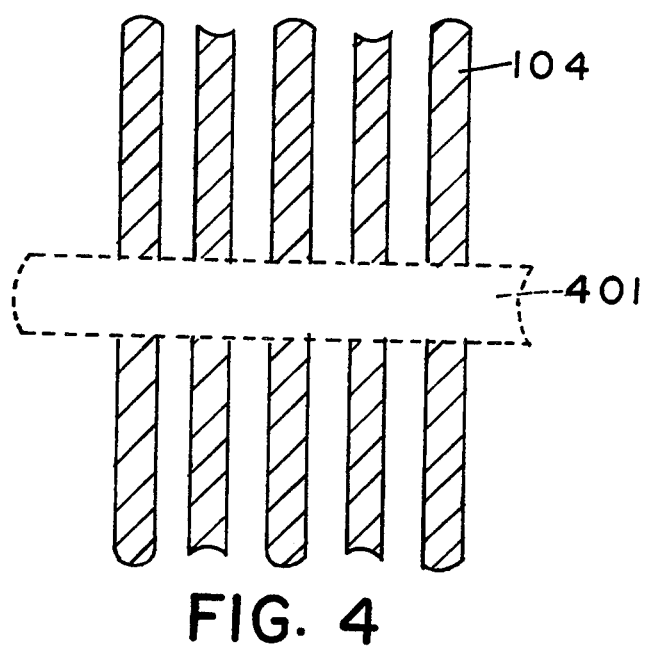

METHOD OF MANUFACTURING A PATTERN OF CONDUCTIVE FINE-LINE FILMS AND SETTING INK USED FOR THE SAME

BACKGROUND OF THE INVENTION

1. Field of the Invention

The present invention relates to a method of manufacturing a pattern of conductive fine-line films on a substrate for an electronic circuit board, and a setting ink used for the same.

2. Description of the Prior Art

Conventionally, conductive fine-line film wirings with a width of 50 $\mu$m or less were formed by photolithography employing etching. The photolithography is an excellent technology capable of forming fine-line patterns of scores of microns in width at high precision, but it requires many complicated process including photoresist coating, exposure, development, etching, and washing, and the apparatuses used in exposure, development, etching and others are large and expensive. In the conventional photolithography, accordingly, the manufacturing cost was very high. On the other hand, the screen printing is an inexpensive pattern forming technique. But, it is difficult for this technique to form conductive fine-line films of several scores of microns stably and at high precision.

In relation to these problems, U.S. Pat. No. 4,479,432 discloses a method of thick film printing using an intaglio and silicone rubber rollers. This method realizes printing of thick film fine-line wiring in a width of 30 $\mu$m to 100 $\mu$m, and a thickness of about 5 to several scores of microns. In this method, however, since a rubber of relatively soft hardness of 30 degrees or less (JIS K 6301 Shore hardness A) is used, the rubber is easily deformed, and it is impossible to print fine-line patterns excellent in dimensional precision. Besides, the intaglio is generally manufactured by the wet etching process. When a steel-made intaglio made by the wet etching process is used, it is difficult to form the groove edges in an extremely excellent linearity. Accordingly, in this method, if fine-line wiring of several scores of microns be printed, it is difficult to obtain a fine-line wiring of sufficiently excellent linearity, and it is impossible to print fine-line wiring in the order of 10 $\mu$m at high quality. Yet, in the intaglio offset printing method, since the end of the fine-line wiring being printed tends to be round, it is impossible to form fine-line patterns with rectangular-shaped ends of fine-line wiring.

SUMMARY OF THE INVENTION

It is hence a primary object of the invention to present a method of manufacturing a pattern of conductive fine-line films at low cost by lift-off technique, capable of obtaining a conductive fine-line film wiring of several scores or less of microns by making use of a simple printing process, and also to present a setting ink excellent in printability to be used in this method of manufacturing a pattern of conductive fine-line films mentioned above.

The pattern forming method of the invention comprises a step of forming a lower layer pattern for printing on a substrate a setting ink which can be set by heat or light, a step of setting this setting ink, a step of forming an upper layer pattern by making use of a printing method for forming a metalo-organic compound paste layer on the lower layer pattern after the setting step, and a step of firing the lower layer pattern at a high temperature and removing it together with an upper paste layer formed thereon. In the upper layer pattern forming step, the metalo-organic compound paste is printed so that the metalo-organic compound paste may be divided on the hardened setting ink so as to fill up gaps in the lower layer pattern. Alternatively, in the upper layer pattern forming step, the metalo-organic compound paste is printed on the hardened setting ink, and the metalo-organic compound paste is mechanically cut off on the hardened setting ink before the metalo-organic compound paste is dried, thereby forming the upper layer pattern.

In this method of manufacturing a pattern of conductive fine-line films, it is preferred to employ the intaglio offset printing technique for the purpose of forming fine-line film patterns mainly superior in the positional precision and excellent in linearity of edges of fine-line film wiring. In this case, it is desired to use a glass intaglio with groove depth of 10 $\mu$m or more, and a cylindrical transfer roll whose outermost layer is made of a silicone rubber elastic material having a rubber hardness of 35 degrees or more according to JIS K 6301 which corresponds to Shore hardness A and a thickness of 2 mm or less. It is desired to print the setting ink and the metalo-organic compound paste in the printing conditions of an identical printing pressure on the intaglio and on the substrate to be printed, and a relative moving speed of 40 mm/sec or less of the intaglio to the cylindrical transfer roll on the intaglio. The metalo-organic compound paste may preferably contain a solvent by 30 wt. % or more and have a viscosity of 3 to 10 Pa.s at 25° C.

As the material for realizing this method of manufacturing a pattern of conductive fine-line films, the setting ink of the invention comprises a thermo-setting resin, a setting agent and an organic solvent, with the amount of nonvolatile materials ranging from 50 to 70 wt. %, or comprises a carbon powder, a thermo-setting resin, a setting agent and an organic solvent, with the amount of nonvolatile materials ranging from 60 to 80 wt. %. In the former case, considering the printability and life of the setting ink, the organic solvent may preferably comprises at least one of butyl carbitol acetate, $\sigma$-terpineol, n-butyl carbitol, 2,2,4-trimethyl-1,3-hydroxypentyl-isobutylate, 2-butoxy ethanol and 2-ethoxy ethanol, the thermo-setting resin may preferably be an epoxy resin, and the setting agent may preferably be dicyandiamide. In the latter case, also considering the printability and life of the setting ink, the organic solvent may preferably comprise at least one of butyl carbitol acetate, $\sigma$-terpineol, n-butyl carbitol, 2,2,4-trimethyl-1,3-hydroxypentyl-isobutylate, 2-butoxy ethanol and 2-ethoxy ethanol, the particle diameter of the carbon powder may preferably be 1 $\mu$m or less, the thermo-setting resin may preferably be an epoxy resin with an average molecular weight ranging from 450 to 5,000, a ratio by weight of the epoxy resin to the organic solvent may preferably be 1.0 or more, the setting agent may preferably be dicyandiamide, and the viscosity may preferably be 100 to 150 Pa.s at 25° C. The carbon powder is desired to be graphite powder. Considering the printability and the quality of the conductive fine-line films being manufactured, it is desired to use the setting ink satisfying the following conditions: the organic solvent comprises at least one of butyl carbitol acetate, $\sigma$-terpineol, n-butyl carbitol, 2,2,4-trimethyl-1,3-hydroxypentyl-iso-butylate, 2-butoxy ethanol and 2-ethoxy ethanol; the carbon powder has a particle diameter of 1 μm or less; the thermosetting resin is an epoxy resin with an average molecular weight of 450 to 5,000; a ratio by weight of the epoxy resin to the organic solvent is 1.0 or more; the setting agent is dicyandiamide; and the viscosity is 100 to 150 Pa.s at 25° C.

In this constitution, the pattern of conductive fine-line films with the width of not more than scores of microns, which was conventionally formed only by photolithography, can be manufactured by a printing method, in an excellent linearity and high positional and dimensional precision of within ±10 μm, while the cost may be lowered at the same time because the process and equipment are simple.

BRIEF DESCRIPTION OF THE DRAWINGS

FIG. 1 is a process chart showing a first embodiment of the method of manufacturing a pattern of conductive thin-line films, FIG. 2 is a printing process chart of intaglio offset printing method, FIG. 3 is a process chart showing a second embodiment of the method of manufacturing a pattern of conductive thin-line films, and FIG. 4 is an appearance diagram of a pattern of conductive thin-line films showing the end shape of conductive fine-line films formed by the method of manufacturing a pattern of conductive fine-line films shown in the first embodiment.

DESCRIPTION OF THE PREFERRED EMBODIMENTS

Referring now to the drawings, some of the embodiments of the method of forming a pattern of conductive fine-line films and the setting ink to be used therein are described in detail below.

FIG. 1 is a process chart showing a first embodiment of the method of manufacturing a pattern of conductive fine-line films of the invention. In FIG. 1, (a) is a lower layer pattern forming step for printing a setting ink on a substrate, (b) is a setting step for setting the setting ink by light or heat, (c) is an upper layer pattern forming step for forming a metalo-organic compound paste layer on the lower layer pattern by making use of printing method, (d) is a firing step for firing at high temperature to remove the lower layer pattern, and (e) is a substrate on which a pattern of conductive thin-line films is formed. Also in FIG. 1, numeral 101 is a glazed alumina substrate, 102 is a setting ink, 103 is a metalo-organic compound paste, and 104 is a conductive fine-line film. The glazed alumina substrate 101 is used after cleaning and drying, and the setting ink 102 is printed in stripes by intaglio offset printing method. FIG. 2 shows the printing process chart of intaglio offset printing method. In FIG. 2, (a) is a step of filling intaglio grooves with ink, (b) is a step of transferring the ink, and (c) is a step of printing the ink on the substrate. Also in FIG. 2, numeral 201 is a scraper, 202 is a glass intaglio, and 203 is a cylindrical transfer roll.

The lower layer pattern may be formed in the following procedure. The setting ink 102 is supplied on the glass intaglio 202, and while scraping the surplus setting ink 102 by the scraper 201, the grooves of the glass intaglio are filled with the setting ink 102. Afterwards, setting the relative moving speed of the glass intaglio 202 to the cylindrical transfer roll 203 on the glass intaglio 202 at 20 mm/sec, the patterned setting ink 102 is once transferred on the surface of the cylindrical transfer roll 203, and then printed on the glazed alumina substrate 101. At this time, the relative moving speed of the glazed alumina substrate 101 to the cylindrical transfer roll 203 is 20 mm/sec, and the printing pressure in the transfer and printing steps is 5 kgf/cm². In order to print the pattern size as accurately as possible on the glass intaglio 202, the printing pressure is desired to be constant. In this intaglio offset printing, in order to print fine-line film of excellent linearity, the glass intaglio 202 with groove depth of 10 μm or more fabricated by wet etching may be used, and in order to achieve the printing position precision within ±10 μm, the cylindrical transfer roll 203 may have its outermost layer made of silicone rubber with a rubber hardness of 52 degrees (the hardness in the invention always refer to JIS K 6301 Shore hardness A) and with a thickness of 2 mm or less. The relative moving speed of the intaglio to the cylindrical transfer roll 203 on the intaglio is desired to be 40 mm/sec or less, considering the quality of the fine lines to be printed. After thus forming the layer pattern, the setting ink 102 is set by light or heat. Next, the metalo-organic compound paste 103 is printed on the hardened setting ink by the same intaglio offset printing method in the similar conditions (except that the stripe pattern is deviated by half pitch in the widthwise direction of the fine-line film). At this time, metalo-organic compound paste 103 is printed so that the metalo-organic compound paste 103 may be divided on the hardened setting ink 102 and fill up gaps in the lower layer pattern at the same time. In consequence, the glazed alumina substrate 101 is fired in a temperature profile of peak temperature of 800° C. to 850° C., and in-out time of 1 hour by using an electric belt furnace, and the lower layer pattern is fired and removed. As a result, the paste on the lower layer pattern is also removed, and the conductive pattern of fine-line film 104 if formed. After firing, if burrs are left over on the conductive pattern of fine-line film 104, it is required to remove burrs by means of tacky rubber roller or the like.

The setting ink 102 to be used comprises a carbon powder, a thermo-setting resin, a setting agent and an organic solvent, with the amount of nonvolatile materials ranging from 60 to 80 wt. %. Preferably, the organic solvent comprises at least one of butyl carbitol acetate, σ-terpineol, n-butyl carbitol, 2,2,4-trimethyl-1,3-hydroxypentyl-iso-butylate, 2-butoxy ethanol, and 2-ethoxy ethanol. More preferably, the particle diameter of carbon powder is 1 μm or less, the thermo-setting resin is an epoxy resin with the average molecular weight of 450 to 5,000, the setting agent is dicyandiamide, and the ratio by weight of the epoxy resin to the organic solvent is 1.0 or more. Or preferably, the viscosity of the setting ink 102 is 100 to 150 Pa.s at 25° C. Moreover, in the upper layer pattern forming step, when printing the metalo-organic compound paste by intaglio offset printing method, it is desired to use the metalo-organic compound paste of which viscosity is 3 to 10 Pa.s at 25° C., containing the solvent by 30 wt. % or more.

In this embodiment, in order to obtain further preferable results, the setting ink 102 and metalo-organic compound paste 103 are formed by intaglio offset printing method, but the printing method is not necessarily limited to the intaglio offset printing method alone in the method of manufacturing a pattern of conductive fine-line films of the invention comprising a step of forming a lower layer pattern for printing a setting ink which is set by heat or light, a step of setting this setting ink, a step of forming an upper layer pattern to be formed by making use of the printing method for forming a metalo-organic compound paste layer on the lower layer pattern after the setting step, and a step of firing the lower layer pattern at high temperature and removing it.

Practical examples using the above embodiment are explained below.

EXAMPLE 1

Using a three-roll steel mill, the setting ink in the following composition was prepared.

| | |
|---|---|
| Carbon powder (graphite powder, average particle diameter 0.7 μm) | 23 (wt. %) |
| Epoxy resin (Yuka Shell Epoxy Co., Epicoat 1007) Averaged molecular weight approx. 3000 | 45 |
| Organic solvent (Kanto Chemical Co., butyl carbitol acetate) | 26 |
| Setting agent (dicyandiamide) | 4 |

Using the setting ink dispersing graphite powder, a lower layer pattern was formed on a glazed alumina substrate by intaglio offset printing method. It was set in the condition of 200° C., 2 hours. The viscosity of the setting ink was 110 Pa.s at 25° C., and the lower layer pattern was a pattern of stripes each being 135 μm in width. In the glass intaglio, grooves of 135 μm in width and 15 μm in depth were formed in stripes at 150 μm pitches. Consequently, on the hardened setting ink (lower layer pattern), a metalo-organic compound paste of Au was printed by shifting half pitch each in the widthwise direction of stripe. The viscosity of the metalo-organic compound paste of Au was prepared at 8 Pa.s at 25° C. After drying it, it was fired at 850° C. The formed pattern of conductive thin-line films of Au contained burrs, and the burrs were removed on a tacky rubber roller. The formed thin-line film wiring of Au presented a high conductivity. By using dicyandiamide, being a latent setting agent, as the setting agent for the setting ink, the highly stable setting ink very slow in the setting speed at ordinary temperature and hardly clogging if filling the grooves of the intaglio with ink was realized as the ink for intaglio offset printing. The printing position accuracy was realized within ±10 μm in a pattern of square of about 100 mm, by using a silicone rubber of which hardness was 52 degrees and thickness was 0.6 mm.

Meanwhile, the butyl carbitol acetate used as the organic solvent was excellent in affinity for silicone rubber on the surface of the cylindrical transfer roll used in the intaglio offset printing method, and it was effective for preparing an ink having a high printability. As the setting ink dispersing carbon powder for intaglio offset printing, the printability is better when the resin content is higher, and it is therefore effective to use an epoxy resin with an averaged molecular weight of 450 to 5000 which is relatively dissolved much in organic solvent. If the averaged molecular weight is less than 450, the resin itself is liquid in ordinary temperature, and it is difficult to prepare an ink excellent in printability. In the invention, moreover, since a narrow space of several scores of microns in width is used in the setting ink pattern (lower layer pattern), if the viscosity of the setting ink dispersing the carbon powder is too lower than 100 Pa.s at 25° C., the lower layer pattern may be linked at the time of printing, and gaps cannot be obtained. To the contrary, if viscosity is too higher than 150 Pa.s, the ink transfer from the intaglio is poor, and lower layer pattern of high quality cannot be obtained.

EXAMPLE 2

Using a three-roll steel mill, the setting ink in the following composition was prepared.

| | |
|---|---|
| Epoxy resin (Yuka Shell Epoxy Co., Epicoat 1002) Averaged molecular weight approx. 1060 | 62 |
| Organic solvent (Kanto Chemical Co., butyl carbitol acetate) | 33 |
| Setting agent (dicyandiamide) | 5 |

Using above setting ink, a pattern of conductive fine-line films of Au was formed in the same process as in Example 1, except that the relative moving speed of the glass intaglio 202 to the cylindrical transfer roll 203 on the glass intaglio 202 in FIG. 2 was 10 mm/sec, and that the patterned setting ink 102 was once transferred on the surface of the cylindrical transfer roller and printed on the glazed alumina substrate 101. At this time, the relative moving speed of the glazed alumina substrate 101 to the cylindrical transfer roll 203 was also set at 10 mm/sec. The metalo-organic compound paste of Au was also the same. The formed pattern of conductive fine-line films of Au in about 15 μm of width had occasional chips of about 2 to 3 μm in width, but presented an excellent conductivity, and its sheet resistance was about 400 mΩ/□ at a thickness of about 1,500 angstroms.

In succession, another embodiment of the method of manufacturing a pattern of conductive fine-line films of the invention is described below while referring to drawings.

FIG. 3 is a process chart showing the second embodiment of the method of manufacturing a pattern of conductive fine-line films. In FIG. 3, (a) is a lower layer pattern forming step for printing a setting ink on a substrate, (b) is a setting step for setting the setting ink by light or heat, (c) is an upper layer pattern forming step for forming a metalo-organic compound paste on the lower layer pattern by printing method, and cutting off the metalo-organic compound paste on the hardened setting ink before drying to form the upper layer pattern, (d) is a firing step of firing at high temperature and removing the lower layer pattern, and (e) is a substrate on which a pattern of conductive fine-line films is formed in a nearly rectangular shape at the front end of the conductive fine-line films. Besides, in FIG. 3, numeral 301 is a cutter. The glazed alumina substrate 101 is used after cleaning and drying, and the setting ink 102 is printed by intaglio offset printing method. The printing process of the intaglio offset printing method is same as used in FIG. 2. The setting ink 102 is supplied on the glass intaglio 202, and the grooves of the glass intaglio are filled with the setting ink 102, while scraping off the surplus setting ink 102 with a scraper 201. In consequence, setting the relative moving speed of the glass intaglio 202 to the cylindrical transfer roll 203 on the glass intaglio 202 at 20 mm/sec, the patterned setting ink 102 is once transferred on the surface of the cylindrical transfer roll 203, and is printed on the glazed alumina substrate 101. At this time, the relative moving speed of the glazed alumina substrate 101 to the cylindrical transfer roller 203 is 20 mm/sec, and the printing pressure in the transfer and printing process is 5 kgf/cm$^2$. In order to print the pattern size as precisely as possible on the glass intaglio 202, the printing pressure is desired to be constant. In the intaglio offset printing method, in order to print fine-line films with high linearity, the glass intaglio 202 with the groove depth of 10 μm or more fabricated by wet etching is used, and in order to achieve the printing position precision within ±10 μm, the cylindrical transfer roll 203 has its outermost layer composed of silicone rubber with a rubber hardness of 52 degrees (the hardness in the invention all refers to the value conforming to JIS K 6301 Shore hardness A) and a thickness of 2 mm or less. The relative moving speed of the intaglio to the cylindrical transfer roll 203 on the intaglio is desired to be 40 mm/sec or less, considering the quality of the printed fine lines. After thus forming the lower layer pattern, the setting ink 102 is set by light or heat. Sequentially, using the glass intaglio 202 for metalo-organic compound paste, by the same intaglio offset printing method and in the same printing conditions, the metalo-organic compound paste 103 is printed on the hardened setting ink, and before the printed metalo-organic compound paste 103 is dried, the printed metalo-organic compound paste 103 is cut off on the hardened setting ink 102 by cutter 301, thereby forming the upper layer pattern. Afterwards, this glazed alumina substrate 101 is fired in a temperature profile of peak temperature of 800°to 850° C. and in-out time of 1 hour in an electric belt furnace, and the lower layer pattern is fired and removed together with the upper paste formed thereon. In consequence, by the fired paste left over on the substrate, the conductive pattern of fine-line film 104 is formed. If there are burrs on the conductive pattern of fine-line film 104 after firing, it is necessary to remove burrs by means of tacky rubber roller or the like.

The setting ink 102 to be used comprises a carbon powder, a thermo-setting resin, a setting agent and an organic solvent, with the amount of nonvolatile materials ranging from 60 to 80 wt. %. Preferably, the organic solvent comprises at least one of butyl carbitol acetate, σ-terpineol, n-butyl carbitol, 2,2,4-trimethyl-1,3-hydroxypentyl-iso-butylate, 2-butoxy ethanol, and 2-ethoxy ethanol. More preferably, the particle diameter of carbon powder is 1 μm or less, the thermo-setting resin is an epoxy resin with the averaged molecular weight of 450 to 5,000, the setting agent is dicyandiamide, and the ratio by weight of epoxy resin to organic solvent is 1.0 or more. Or preferably, the viscosity of the setting ink 102 is 100 to 150 Pa.s at 25° C. Moreover, in the upper layer pattern forming step, when printing the metalo-organic compound paste by intaglio offset printing method, it is desired to use the metalo-organic compound paste of which viscosity is 3 to 10 Pa.s at 25° C., containing the solvent by 30 wt. % or more.

In this embodiment, in order to obtain further preferable results, the setting ink 102 and metalo-organic compound paste 103 are formed by intaglio offset printing method, but the printing method is not necessarily limited to the intaglio offset printing method alone in the method of manufacturing a pattern of conductive fine-line films of the invention comprising a step of forming a lower layer pattern for printing a setting ink which is set by heat or light, a step of setting this setting ink, a step of forming an upper layer pattern to be formed by making use of the printing method for forming a metalo-organic compound paste layer on the lower layer pattern after the setting step, and a step of firing the lower layer pattern at high temperature and removing it.

Practical examples using the above embodiment is explained below.

EXAMPLE 3

FIG. 4 shows an example of a conductive pattern of fine-line film formed according to the embodiment. In FIG. 4, numeral 401 is a lower layer pattern (fine-line of setting ink) formed before the firing step.

Using a three-roll steel mill, the setting ink in the following composition was prepared.

| | |
|---|---|
| Carbon powder (graphite powder, average particle diameter 0.7 μm) | 23 (wt. %) |
| Epoxy resin (Yuka Shell Epoxy Co., Epicoat 1007) Averaged molecular weight approx. 3000 | 45 |
| Organic solvent (Kanto Chemical Co., butyl carbitol acetate) | 13 |
| (Kanto Chemical Co., σ-terpineol) | 13 |
| Setting agent (dicyandiamide) | 4 |

Using the above setting ink, a lower layer pattern made of setting ink was formed as shown by lower layer pattern shape 401 by the intaglio offset printing method on a glazed alumina substrate. The viscosity of setting ink was about 120 Pa.s at 25° C., and the lower layer pattern was a pattern of lines of 150 μm in width. It was set in the conditions of 200° C., 2 hours. In the glass intaglio, grooves of lines of 150 μm in width and 15 μm in depth were formed. Consequently, using the glass intaglio forming stripe patterns in 125 μm pitch, line width of 95 μm and depth of 15 μm, the metalo-organic compound paste of Au was printed in pitch of 125 μm, a stripe of line width of 90 μm and at right angle to the lower layer pattern, and the metalo-organic compound paste of Au was cut off by the cutter, parallel to the lower layer pattern and on the lower layer pattern. It was then dried, fired in air at 850° C. to remove the lower layer pattern, thereby obtaining a conductive pattern of fine-line film having a nearly rectangular end shape. Meanwhile, a thin film of Au was left over as burr, but this burr could be easily removed by tacky rubber roller. Such conductive pattern of fine-line film having nearly rectangular end shape is necessary in a heating part of a thermal printing head or the like, and a superior quality as electrode was obtained, when the electrode pattern of a thermal printing head was formed by using this method, although there were chips of within ±3 μm. This embodiment is a method of forming a conductive fine-line film having nearly rectangular end shape of fine-line wiring, but the method of manufacturing a pattern of conductive fine-line films of the invention is not limited to this method alone.

Some of the embodiments of the invention have been disclosed herein, but the structure of the cylindrical transfer roll 203 used in the intaglio offset printing method is not limited to the illustrated examples alone, and a multilayer structure having a compressive layer, for example, may be employed alike. Besides, the organic solvent may be, aside from butyl carbitol acetate or σ-terpineol shown in the embodiments, any one of the n-butyl carbitol,2,2,4-trimethyl-1,3-hydroxypentyl-iso-butylate, 2-butoxy ethanol or 2-ethoxy ethanol, or their mixed solution. In the invention, since the setting ink is used and the metalo-organic compound paste is printed after setting the setting ink (lower layer pattern), mixing of printed materials (lower layer pattern and upper layer pattern) by solvent may be prevented. If not set, the conductive pattern of fine-line film could not be formed. In the upper layer pattern forming step of the invention, the metalo-organic compound paste is printed so that the metalo-organic compound paste may be divided on the hardened setting ink so as to fill-up the gaps in the lower layer pattern, or the metalo-organic compound paste is cut off mechanically on the hardened setting ink before the metalo-organic compound paste is dried so that the metalo-organic compound paste may cover the hardened setting ink, and that the metalo-organic compound paste by divided on the hardened setting ink, which may contribute to prevention of exfoliation of the conductive fine-line film due to stress caused by sintering of the conductive film at the time of firing of the metalo-organic compound paste.

What is claimed is:

1. A method of manufacturing a pattern of conductive fine-line films, comprising the steps of:
   printing a setting ink on a substrate to form a lower layer pattern so that exposed portions of the substrate separated by the lower pattern remain on the substrate, the setting ink being removable by firing at high temperature;
   setting the setting ink of the lower layer pattern;
   printing a metalo-organic compound paste layer on said substrate on which the lower pattern has been formed to form an upper layer pattern so that all of the exposed portions of the substrate and at least a part of the lower layer pattern are covered by the upper layer pattern; and
   firing at high temperature to remove the lower layer pattern and a portion of the upper layer pattern covering the lower layer pattern leaving the remaining portion of the upper layer pattern as a conductive pattern on a substrate.

2. A method of claim 1, wherein in the step of printing the metalo-organic compound paste layer, the metalo-organic compound paste layer is formed such that portions of the upper layer pattern, which respectively cover adjacent exposed portions of the substrate divided by a part of the lower layer pattern, are separated from each other on said part of the lower layer pattern.

3. A method of claim 1, wherein printing is performed by intaglio offset printing method using an intaglio.

4. A method of claim 3, wherein the intaglio is a glass intaglio.

5. A method of claim 1, wherein the setting ink comprises a carbon powder, an epoxy resin, a setting agent, and an organic solvent, with an amount of nonvolatile materials ranging from 60 to 80 wt. %.

6. A method of claim 5, wherein the organic solvent of the setting ink comprises at least one of butyl carbitol acetate, σ-terpineol, n-butyl carbitol, 2,2,4-trimethyl-1,3-hydroxypentyl-iso-butylate, 2-butoxy ethanol, and 2-ethoxy ethanol.

7. A method of claim 5, wherein a particle diameter of carbon powder is 1 μm or less, an average molecular weight of the epoxy resin is 450 to 5,000, the setting agent is dicyandiamide, and a ratio by weight of the epoxy resin to the organic solvent is 1.0 or more.

8. A method of claim 5, wherein a viscosity of the setting ink is 100 to 150 Pa.s at 25° C.

9. A method of claim 5, wherein the setting ink to be used is defined as follows: the organic solvent comprises at least one of butyl carbitol acetate, σ-terpineol, n-butyl carbitol, 2,2,4-trimethyl-1,3-hydroxypentyl-isobutylate, 2-butoxy ethanol, and 2-ethoxy ethanol; a particle diameter of the carbon powder is 1 μm or less, an average molecular weight of the epoxy resin is 450 to 5,000, a ratio by weight of the epoxy resin to the organic solvent is 1.0 or more, the setting agent is dicyandiamide, and a viscosity is 100 to 150 Pa.s at 25° C.

10. A method of claim 5, wherein the setting ink comprises a carbon powder, an epoxy resin, a setting agent, and an organic solvent, with an amount of nonvolatile materials ranging from 60 to 80 wt. %; the organic solvent comprises at least of butyl carbitol acetate, σ-terpineol, n-butyl carbitol, 2,2,4-trimethyl-1,3-hydroxypentyl-isobutylate, 2-butoxy ethanol, and 2-ethoxy ethanol; the carbon powder is graphite powder with a particle diameter of 1 μm or less; an average molecular weight of the epoxy resin is 450 to 5,000; a ratio by weight of the epoxy resin to the organic solvent is 1.0 or more; the setting agent is dicyandiamide; a viscosity of the setting ink is 100 to 150 Pa.s at 25° C.; and the metalo- organic compound paste contains a solvent by 30 wt. % or more and its viscosity is 3 to 10 Pa.s at 25° C.

11. A method of claim 1, wherein the step of printing the setting ink comprises:
   filling grooves on an intaglio with the setting ink, each of said grooves having a depth of 10 μm or more;
   pressing a cylindrical transfer roll onto the intaglio at a predetermined pressure while moving the cylindrical transfer roll relative to the intaglio at a relative moving speed of 40 mm/sec or less to transfer the setting ink in the grooves to the cylindrical transfer roll, the cylindrical transfer roll having an outermost layer of a thickness of 2 mm or less made of a silicone rubber elastic material which has a rubber hardness of 35 degrees or more according to JIS K 6301 which corresponds to Shore hardness A; and
   pressing the cylindrical transfer roll onto the substrate at said predetermined pressure to transfer the setting ink to the substrate.

12. A method of claim 1, wherein the step of printing the metalo-organic compound paste comprises:
   filling grooves of an intaglio with the metalo-organic compound paste, each of said grooves having a depth of 10 μm or more;
   pressing a cylindrical transfer roll onto the intaglio at a predetermined pressure while moving the cylindrical transfer roll relative to the intaglio at a relative moving speed of 40 mm/sec or less to transfer the metalo-organic compound paste in the grooves to the cylindrical transfer roll, the cylindrical transfer roll having an outermost layer of a thickness of 2 mm or less made of a silicone rubber elastic material which has a rubber hardness of 35 degrees or more according to JIS K 6301 which corresponds to Shore hardness A; and
   pressing the cylindrical transfer roll onto the substrate at said predetermined pressure to transfer the metalo-organic compound paste to the substrate on which the lower layer pattern has been formed.

13. A method of claim 1, wherein the step of printing the metalo-organic compound paste includes a step of cutting the upper layer pattern on the lower layer pattern such that portions of the upper layer pattern which respectively cover adjacent exposed portions of the substrate divided by a part of the lower layer pattern are separated from each other on said part of the lower layer pattern.

14. A method of claim 13, wherein the setting ink is printed in an intaglio offset printing method using a glass intaglio with a groove depth of 10 μm or more, and a cylindrical transfer roll whose outermost layer is made of a silicone rubber elastic material having a rubber hardness of 35 degrees or more (JIS K 6301 Shore hardness A) and a thickness of 2 mm or less, in printing conditions of an identical printing pressure on the intaglio and on the substrate, and a relative moving speed of the intaglio to the cylindrical transfer roll on the intaglio of 40 mm/sec or less.

15. A method of claim 13, wherein the setting ink comprises a carbon powder, an epoxy resin, a setting agent, and an organic solvent, with an amount of nonvolatile materials ranging from 60 to 80 wt. %; the organic solvent comprises at least one of butyl carbitol acetate, σ-terpineol, n-butyl carbitol, 2,2,4-trimethyl-1,3-hydroxypentyl-iso-butylate, 2-butoxy ethanol, and 2-ethoxy ethanol; the carbon powder is graphite powder with a particle diameter of 1 μm or less; an average molecular weight of the epoxy resin is 450 to 5,000; a ratio by weight of the epoxy resin to the organic solvent is 1.0 or more; the setting agent is dicyandiamide; a viscosity of the setting ink is 100 to 150 Pa.s at 25° C.; and the metalo-organic compound paste contains a solvent by 30 wt. % or more and its viscosity is 3 to 10 Pa.s at 25° C.

* * * * *